United States Patent [19]
Camilletti et al.

[11] Patent Number: 5,710,203
[45] Date of Patent: *Jan. 20, 1998

[54] ELECTRONIC COATING COMPOSITIONS

[75] Inventors: Robert Charles Camilletti; Loren Andrew Haluska; Keith Winton Michael, all of Midland, Mich.

[73] Assignee: Dow Corning Corporation, Midland, Mich.

[*] Notice: The term of this patent shall not extend beyond the expiration date of Pat. No. 5,387,480.

[21] Appl. No.: 334,988

[22] Filed: Nov. 7, 1994

Related U.S. Application Data

[60] Division of Ser. No. 103,142, Aug. 9, 1993, abandoned, which is a continuation-in-part of Ser. No. 28,063, Mar. 8, 1993.

[51] Int. Cl.$^6$ .............................. C08K 3/10; C04B 38/00
[52] U.S. Cl. .............. 524/435; 524/434; 524/436; 524/442; 524/783; 524/784; 524/785; 524/779; 524/789; 524/860; 524/861; 524/858; 524/588; 501/88; 501/80
[58] Field of Search ................... 501/88, 80; 524/588, 524/434, 435, 436, 442, 858, 860, 861, 783, 784, 785, 779, 789

[56] References Cited

U.S. PATENT DOCUMENTS

| | | | |
|---|---|---|---|
| 3,986,997 | 10/1976 | Clark | 260/29.2 M |
| 4,749,631 | 6/1988 | Haluska et al. | 428/704 |
| 4,756,977 | 7/1988 | Haluska et al. | 428/704 |
| 4,997,698 | 3/1991 | Oboodi et al. | 428/209 |
| 5,063,267 | 11/1991 | Hanneman et al. | 524/284 |
| 5,085,893 | 2/1992 | Weiss et al. | 427/387 |
| 5,387,480 | 2/1995 | Haluska et al. | 428/698 |

*Primary Examiner*—Karen A. Dean
*Attorney, Agent, or Firm*—Sharon K. Severance

[57] ABSTRACT

Disclosed are compositions which can be used to form tamper-proof coatings on electronic devices. These compositions contain a silica precursor resin and a filler which reacts in an oxidizing atmosphere to liberate heat. Such compositions form coatings which, when oxidized by techniques such as plasma etching, wet etching, or cross-sectioning, liberate heat which causes destruction of the underlying substrate and, thus, inhibits further examination.

8 Claims, No Drawings

ELECTRONIC COATING COMPOSITIONS

This is a divisional of application Ser. No. 08/103,142 filed on Aug. 9, 1993, abandoned, which is a continuation-in-part of Ser. No. 08/028,063 filed on Mar. 8, 1993.

BACKGROUND OF THE INVENTION

The dissection of electronic devices is a major source of information for both commercial competitors as well as foreign governments. In most instances, the devices are analyzed by techniques such as cross-sectioning and etching. The present invention relates to coatings comprising silica-containing matrices and certain fillers which inhibit this type of examination.

The use of silica-containing ceramic coatings on substrates such as electronic devices is known in the art. For instance, Haluska et al. in U.S. Pat. Nos. 4,749,631 and 4,756,977 disclose processes for forming silica coatings on electronic substrates wherein solutions of silica precursor resins are applied to substrates followed by heating the coated substrates in air at a temperature in the range of 200°–1000° C. These references, however, do not describe the use of fillers within the coating.

Similarly, the use of fillers within ceramic coatings is also known in the art. For instance, U.S. Pat. No. 3,986,997 describes a composition comprising an acidic dispersion of colloidal silica and hydroxylated silsesquioxane in an alcohol-water medium which can be used to apply transparent abrasion resistant coatings on a variety of substrates. The reference, however, does not describe the use of the fillers described herein nor the application of a coating on an electronic substrate.

The present inventors have now discovered that tamper-proof coatings for electronic circuits can be formed from compositions comprising silica precursor resins and certain fillers.

SUMMARY OF THE INVENTION

The present invention relates to a method of forming a tamper-proof coating on an electronic substrate and the substrate coated thereby. The method comprises first applying a composition comprising a silica precursor resin and a filler onto the substrate. The filler used is one which reacts in an oxidizing atmosphere to liberate heat. The coated substrate is then heated at a temperature sufficient to convert the coating composition to a ceramic coating.

The present invention also relates to a coating composition comprising a silica precursor resin and a filler which reacts in an oxidizing atmosphere to liberate heat.

DETAILED DESCRIPTION OF THE INVENTION

The present invention is based on the discovery that tamper-proof coatings can be formed from compositions comprising silica precursor resins and fillers which react in oxidizing atmospheres to liberate heat. When these coatings are analyzed by, for example, plasma etching, wet etching, or cross-sectioning, the fillers are oxidized and liberate heat which causes destruction of the underlying substrate and, thus, inhibits further examination and/or reverse engineering.

As used in the present invention, the expression "silica containing matrix" is used to describe the hard coating obtained after heating the silica precursor resin. This coating contains both amorphous silica ($SiO_2$) materials as well as amorphous silica-like materials that are not fully free of residual carbon, silanol (Si—OH) and/or hydrogen (which are obtained upon heating the silica precursor resin) and the filler materials. The expression "filler" is used to describe a finely divided solid phase which is distributed within the resin and the final ceramic coating. The expression "electronic substrate" is meant to include, but is not limited to, electronic devices or electronic circuits such as silicon based devices, gallium arsenide based devices, focal plane arrays, opto-electronic devices, photovoltaic cells and optical devices.

In the process of the present invention a ceramic coating is formed on a substrate by a process which comprises applying a coating composition comprising a silica precursor resin and a filler which reacts in an oxidizing environment to liberate heat onto the substrate and then heating the coated substrate in an inert atmosphere at a temperature sufficient to convert the composition to a silica-containing ceramic matrix having the filler distributed therein.

The silica precursor resins which may be used in the invention include, but are not limited to, hydrogen silsesquioxane resin (H-resin), hydrolyzed or partially hydrolyzed $R_nSi(OR)_{4-n}$, or combinations of the above, in which R is an aliphatic, alicyclic or aromatic substituent of 1–20 carbon atoms such as an alkyl (eg. methyl, ethyl, propyl), alkenyl (eg. vinyl or allyl), alkynyl (eg. ethynyl), cyclopentyl, cyclohexyl, phenyl etc., and n is 0–3.

The hydrogen silsesquioxane resins (H-resin) which may be used in this invention include hydridosiloxane resins of the formula $HSi(OH)_x(OR)_yO_{z/2}$, in which each R is independently an organic group or a substituted organic group which, when bonded to silicon through the oxygen atom, forms a hydrolyzable substituent, x=0–2, y=0–2, z=1–3, x+y+z=3. Examples of R include alkyls such as methyl, ethyl, propyl, butyl, etc., aryls such as phenyl, and alkenyls such as allyl or vinyl. As such, these resins may be fully condensed $(HSiO_{3/2})_n$ or they may be only partially hydrolyzed (i.e., containing some Si—OR) and/or partially condensed (i.e., containing some Si—OH). Although not represented by this structure, these resins may contain a small number (eg., less than about 10%) of silicon atoms which have either 0 or 2 hydrogen atoms attached thereto due to various factors involved in their formation or handling.

The above H-resins and methods for their production are known in the art. For example, Collins et al. in U.S. Pat. No. 3,615,272, which is incorporated herein by reference, teach the production of a nearly fully condensed H-resin (which may contain up to 100–300 ppm silanol) by a process comprising hydrolyzing trichlorosilane in a benzenesulfonic acid hydrate hydrolysis medium and then washing the resultant resin with water or aqueous sulfuric acid. Similarly, Bank et al. in U.S. Pat. No. 5,010,159, which is hereby incorporated by reference, teach an alternative method comprising hydrolyzing hydridosilanes in an arylsulfonic acid hydrate hydrolysis medium to form a resin which is then contacted with a neutralizing agent.

Other hydridosiloxane resins, such as those described by Frye et al. in U.S. Pat. No. 4,999,397, hereby incorporated by reference, those produced by hydrolyzing an alkoxy or acyloxy silane in an acidic, alcoholic hydrolysis medium, those described in Kokai Patent Nos. 59-178749, 60-86017 and 63-107122, or any other equivalent hydridosiloxane, will also function herein.

It is to be noted that in a preferred embodiment of the invention, specific molecular weight fractions of the above H-resins may also be used in this process. Such fraction and methods for their preparation are taught by Hanneman et al. in U.S. Pat. No. 5,063,267 which is hereby incorporated by reference. A preferred fraction comprises material wherein at least 75% of the polymeric species have a molecular weight above about 1200 and a more preferred fraction comprises material wherein at least 75% of the polymeric species have a molecular weight between about 1200 and about 100,000.

The second type of silica precursor resin useful herein includes hydrolyzed or partially hydrolyzed compounds of the formula $R_nSi(OR)_{4-n}$, in which R and n are as defined above. Some of these materials are commercially available, for example, under the tradename ACCUGLASS. Specific compounds of this type include methyltriethoxysilane, phenyltriethoxysilane, diethyldiethoxysilane, methyltrimethoxysilane, dimethyldimethoxysilane, phenyltrimethoxysilane, vinyltrimethoxysilane, tetramethoxysilane, tetraethoxysilane, tetrapropoxysilane, and tetrabutoxysilane. After hydrolysis or partial hydrolysis of these compounds, the silicon atoms therein may be bonded to C, OH or OR groups, but a substantial portion of the material is believed to be condensed in the form of soluble Si—O—Si resins. Compounds in which x=2 are generally not used alone as volatile cyclic structures are generated during pyrolysis, but small amounts of said compounds may be co-hydrolyzed with other silanes to prepare useful preceramic materials.

The coating composition may also contain other ceramic oxide precursors. Examples of such ceramic oxide precursors include compounds of various metals such as aluminum, titanium, zirconium, tantalum, niobium and/or vanadium as well as various non-metallic compounds such as those of boron or phosphorous which may be dissolved in solution, hydrolyzed, and subsequently pyrolyzed, at relatively low temperatures and relatively rapid reaction rates to form ceramic oxide coatings.

The above ceramic oxide precursor compounds generally have one or more hydrolyzable groups bonded to the above metal or non-metal, depending on the valence of the metal. The number of hydrolyzable groups to be included in these compounds is not critical as long as the compound is soluble in the solvent. Likewise, selection of the exact hydrolyzable substituent is not critical since the substituents are either hydrolyzed or pyrolyzed out of the system. Typical hydrolyzable groups include, but are not limited to, alkoxy, such as methoxy, propoxy, butoxy and hexoxy, acyloxy, such as acetoxy, or other organic groups bonded to said metal or non-metal through an oxygen such as acetylacetonate. Specific compounds, therefore, include zirconium tetracetylacetonate, titanium dibutoxy diacetylacetonate, aluminum triacetylacetonate and tetraisobutoxy titanium.

When hydrogen silsesquioxane resin is to be combined with one of the above ceramic oxide precursors, generally it is used in an amount such that the final ceramic coating contains 0.1 to about 30 percent by weight modifying ceramic oxide.

The coating composition may also contain a platinum, rhodium or copper catalyst to increase the rate and extent of conversion to silica. Generally, any platinum, rhodium or copper compound or complex which can be solubilized will be functional. For instance, a composition such as platinum acetylacetonate, rhodium catalyst $RhCl_3[S(CH_2CH_2CH_2CH_3)_2]_3$, obtained from Dow Corning Corporation, Midland, Mich., or cupric naphthenate are all within the scope of this invention. These catalysts are generally added in an amount of between about 5 to 1000 ppm platinum, rhodium or copper based on the weight of hydrogen silsesquioxane resin.

The fillers used herein are known in the art for use in coatings with other polymers. These included various inorganic and organic fillers, especially inorganic fillers, in a variety of morphologies including, but not limited to powders, particles, flakes, microballoons and the like. Examples of inorganic fillers include synthetic and natural materials such as the oxides, nitrides, borides and carbides of various metals and non-metals such as glass, alumina, silica, titanium dioxide, zinc oxide, tungsten oxide, and ruthenium oxide, titanates such as potassium titanate and barium titanate, niobates such as lithium niobate and lead niobate, barium sulfate, calcium carbonate, precipitated diatomite, aluminum silicate or other silicates, pigments, phosphors, metals such as silver, aluminum and copper; wollostonite, mica, kaolins clays talc and the like. Also, some organic materials such as cellulose, polyamides, phenol resins and the like may be used.

The preferred fillers to be used herein are those which react in an oxidizing environment to liberate enough heat to damage and/or destroy the underlying substrate. When these fillers are oxidized by, for example, plasma etching, wet etchings or cross-sectioning, they liberate heat which causes destruction of the underlying substrate and, thus, inhibits further examination. These fillers include, for example, metals such as magnesium, iron, silicon, tin and zinc.

The particle size and shape of the above fillers can vary over a wide range depending on factors such as the type of filler, the desired coating thickness, etc.

The amount of filler used in the present invention can also be varied over a wide range depending, for example, on the quality and electrical characteristics desired in the final coating. Generally, however, the fillers are used in an amount less than about 90 weight percent of the coating to insure that enough resin is present to bind the filler. Obviously, smaller amounts of fillers (eg., 1–5 wt. %) can also be used. A preferred amount of filler is in the range of about 5 to about 80 wt. percent of the coating.

If desired, other materials may also be present in the coating composition. For instance, it is within the scope of the present invention to use a material which modifies the surface of the filler for better adhesion. Such materials can include, for example, silanes such as glycidoxypropyltrimethoxysilane, mercaptopropyltrimethoxysilane, and vinyltriacetoxysilane. Similarly, it is within the scope of the invention to include suspending agents in the coating composition. These and other optional components are known to those skilled in the art.

According to the process of the invention, the silica precursor resin, filler and any optional components are applied to the surface of an electronic device. The surface of the electronic device can be bare (i.e., no passivation) or the circuit can have a primary passivation. Such primary passivation can be, for example, ceramic coatings such as silica, silicon nitride, silicon carbide, silicon oxynitride, silicon oxycarbide, etc. deposited by, for example, CVD, PVD, or sol-gel approaches. Such primary passivation is known to those skilled in the art.

The coating according to the present invention can be applied in any manner, but a preferred method involves dissolving the silica precursor resin in a solvent and dispersing the filler and any optional components therein. This dispersion is then applied to the surface of the substrate. Various facilitating measures such as stirring and/or heating may be used to dissolve or disperse the silica precursor resin and filler and create a more uniform application material. Solvents which may be used include any agent or mixture of agents which will dissolve or disperse the silica precursor resin and filler to form a homogenous liquid mixture without affecting the resultant coating. These solvents can include, for example, alcohols such as ethyl or isopropyl, aromatic hydrocarbons such as benzene or toluene, alkanes such as n-heptane or dodecane, ketones, esters, glycol ethers, or cyclic dimethylpolysiloxanes, in an amount sufficient to dissolve/disperse the above materials to the concentration desired for application. Generally, enough of the above solvent is used to form a 0.1–80 weight percent mixture, preferably 1–50 wt. percent.

If a liquid method is used, the liquid mixture comprising the silica precursor resin, filler, solvent, and, any optional components is then coated onto the substrate. The method of coating can be, but is not limited to, spin coating, dip coating, spray coating or flow coating. Other equivalent means, however, are also deemed to be within the scope of this invention.

The solvent is then allowed to evaporate from the coated substrate resulting in the deposition of the silica precursor resin and filler coating. Any suitable means of evaporation may be used such as simple air drying by exposure to an ambient environment, by the application of a vacuum or mild heat (eg., less than 50° C.) or during the early stages of the heat treatment. It is to be noted that when spin coating is used, the additional drying period is minimized as the spinning drives off the solvent.

Although the above described methods primarily focus on using a liquid approach, one skilled in the art would recognize that ether equivalent means (eg., melt coating) would also function herein and are contemplated to be within the scope of this invention.

The silica precursor resin and filler coating is then typically converted to a silica-containing ceramic matrix having the filler distributed therein by heating it to a sufficient temperature. Generally, the temperature is in the range of about 50° to about 1000° C. depending on the pyrolysis atmosphere. Preferred temperatures are in the range of about 50° to about 800° C. and more preferably 50°–450° C. to prevent damage to the electronic device. Heating is generally conducted for a time sufficient to ceramify, generally up to about 6 hours, with less than about 3 hours being preferred.

The above heating may be conducted at any effective atmospheric pressure from vacuum to superatmospheric and under any effective non-oxidizing gaseous environment such as all inert gas ($N_2$, Ar, He, etc.).

Any method of heating such as the use of a convection oven, rapid thermal processing, hot plate, or radiant or microwave energy is generally functional herein. The rate of heating, moreover, is also not critical, but it is most practical and preferred to heat as rapidly as possible.

By the above methods a ceramic coating is produced on the substrate. The thickness of the coating can vary over a wide range (eg., up to 500 microns) as described above. These coatings smooth the irregular surfaces of various substrates, they are relatively defect free and they have excellent adhesive properties. As such, they are particularly useful for a variety of electronic applications such as protective layers. In addition, the coatings are tamper-proof such that examination by a method which causes oxidation of the filler will result in destruction of the electronic device.

Additional coatings may be applied over these coatings if desired. These can include, for example, $SiO_2$ coatings, $SiO_2$/ceramic oxide layers, silicon containing coatings, silicon carbon containing coatings, silicon nitrogen containing coatings, silicon oxygen nitrogen coatings, silicon nitrogen carbon containing coatings and/or diamond like carbon coatings. Methods for the application of such coatings are known in the art and many are described in U.S. Pat. No. 4,756,977, which is incorporated herein by reference. An especially preferred coating is silicon carbide applied by the chemical vapor deposition of an organosilcon precursor. One example of such a process is described in U.S. Pat. No. 5,011,706 which is incorporated herein by reference. A second example involves the chemical vapor deposition utilizing trimethylsilane as the source gas. The most preferred coating comprises silicon carbide deposited in a non-uniform thickness such that uniform etching is difficult.

The following non-limiting examples are included so that one skilled in the art may more readily understand the invention.

EXAMPLE 1

Eccospheres™ DCT-28-27 (silica glass microballoons with a particle size range of 10–40 microns), 0.2 g, were ground in a mortar and pestle for about 20 minutes to decrease the particle size. A coating composition was then formed by mixing the ground glass, 0.7 g of Hydrogen silsesquioxane resin made by the method of Collins et al. in U.S. Pat. No. 3,615,273, and 0.012 g glycidoxypropyltrimethoxysilane and 0.36 g dodecane. The coating composition was applied to the surface of 2–3"X5" aluminum panels; one using a 3 mil applicator to apply a 2 mil coating and the second using a 4 mil applicator to apply a 3 mil coating. The coatings were allowed to dry for 1 hour at 64° C. The coated panels were then heated at 185° C. for 1 hour and at 410° C. for 45 minutes. The dielectric constant and dissipation factor for the 3 mil coating are as follows:

| Frequency | Dielectric Constant | Dissipation Factor |
|---|---|---|
| 100 HZ | 2.43 | 0.106 |
| 1 KHZ | 2.21 | 0.097 |
| 10 KHZ | 2.13 | 0.019 |
| 100 KHZ | 2.08 | 0.009 |

The spheres had a dielectric constant=1.17 (1–8.6 GHZ) and dissipation factor=0.001 (1–8.6 GHZ).

EXAMPLE 2

A coating composition was formed by mixing 0.12 g Eccospheres SDT-28-27 (not crushed), 0.12 g 5 micron Minusil (silica), 0.7 g of Hydrogen silsesquioxane resin made by the method of Collins et al. in U.S. Pat. No. 3,615,273, 0.012 g glycidoxypropyltrimethoxysilane and 0.456 g dodecane. The coating composition was applied to the surface of various substrates and processed as set out in the following table:

| Substrate | Film Applicator | Air Dry | 185° C. | 410° C. | Thickness (micron) |
|---|---|---|---|---|---|
| 3" X6" Al Panel | 3 mil | 3 hr | 1.75 hr | 1.25 hr | 20 |
| 3" X6" Al Panel | 4 mil | 3 hr | 1.75 hr | 1.25 hr | 41 |
| 3" X6" Al Panel | 5 mil | 3 hr | 1.75 hr | 1.25 hr | 48 |
| 3" Si Wafer | 3 mil | 3 hr | 0.75 hr | 1.00 hr | 24 |
| 2" sq 10,000 A gold on nichrome | 3 mil | 3 hr | 0.75 hr | 1.00 hr | 22 |

-continued

| Substrate | Film Applicator | Air Dry | 185° C. | 410° C. | Thickness (micron) |
|---|---|---|---|---|---|
| 2" sq wafer —Al coated | 6 mil | 3 hr | 0.75 hr | 1.00 hr | 42 |
| Al interdigitated pattern on 2" Si wafer | 6 mil | 3 hr | 0.75 hr | 1.00 hr | 22 |

The aluminum interdigitated pattern on the silicon wafer coated above was tested for porosity, pinhole density, and barrier layer ability by MIL STD 883C, Method 2021-3, Procedure B, for determining glassivation layer integrity with a phosphoric acid etch solution. The Etch solution consists of 16 parts conc. phosphoric acid, 2 parts deionized water, 1 part concentrated nitric acid and 1 part glacial acetic acid. The sample was tested by applying 1 drop of the etch solution on the surface of the coating for a period of 50 minutes (30 minutes=normal exposure time). The sample was next rinsed with distilled water and allowed to dry. Examination of the test area on the coating showed the film was intact and there was no evidence of any corrosion. The dielectric constant and dissipation factor for the 3"X6" aluminum panel coated above with the 41 micron thick coating are as follows:

| Frequency | Dielectric Constant | Dissipation Factor |
|---|---|---|
| 100 HZ | 2.42 | 0.032 |
| 1 KHZ | 2.35 | 0.014 |
| 10 KHZ | 2.32 | 0.006 |
| 100 KHZ | 2.31 | 0.004 |

EXAMPLE 3

A coating composition was formed by mixing 0.12 g Eccospheres SDT-28-27 (not crushed), 0.12 g plasma alumina, average particle size=6 microns (Product No. 13,699, ZYP Coatings, Inc.), 0.7 g of Hydrogen silsesquioxane resin made by the method of Collins et al. in U.S. Pat. No. 3,615,273, 0.012 g glycidoxypropyltrimethoxysilane and 0.456 g dodecane. The coating composition was applied to the surface of a 3"X5" aluminum panel using a 3 mil applicator. The coatings were allowed to dry for 3 hours at 64° C. The coated panels were then heated at 185° C. for 1 hour and at 400° C. for 1 hour. A 31 micron thick coating was obtained. The dielectric constant and dissipation factor for the coating are as follows:

| Frequency | Dielectric Constant | Dissipation Factor |
|---|---|---|
| 100 HZ | 2.04 | 0.058 |
| 1 KHZ | 1.94 | 0.030 |
| 10 KHZ | 1.87 | 0.020 |
| 100 KHZ | 1.82 | 0.015 |

EXAMPLE 4

A coating composition was formed by mixing 0.15 g plasma alumina, average particle size=6 microns (Product No. 13,699, ZYP Coatings, Inc.), 0.7 g of Hydrogen silsesquioxane resin made by the method of Collins et al. in U.S. Pat. No. 3,615,273, 0.024 g glycidoxypropyltrimethoxysilane and 0.271 g dodecane. The coating composition was applied to the surface of a 3"X5" aluminum panel using a 2 mil applicator. The coatings were allowed to dry for 4 hours at 64° C. The coated panels were then heated at 185° C. for 1 hour and at 400° C. for 1 hour. A 36 micron thick coating was obtained. The dielectric constant and dissipation factor for the coating are as follows:

| Frequency | Dielectric Constant | Dissipation Factor |
|---|---|---|
| 100 HZ | 2.23 | 0.038 |
| 1 KHZ | 2.15 | 0.017 |
| 10 KHZ | 2.12 | 0.008 |
| 100 KHZ | 2.10 | 0.005 |

EXAMPLE 5

Nalco 84SS-258 (30% colloidal silica with a particle size of 20 nanometer diluted in a glycol propyl ether), 1.08 g, 0.6 g of Hydrogen silsesquioxane resin made by the method of Collins et al. in U.S. Pat. No. 3,615,273, and 1.08 g 2-(2-butoxyethoxy)ethyl acetate were mixed in 1.11 g methyl ethyl ketone. The coating composition was applied to the surface of 10 Motorola 14011B CMOS devices and spun at 3000 RPM for 10 seconds. A 1 inch square silicon wafer was also coated in the same manner. The coated materials were then heated at 400° C. for 2.5 hours in air. The CMOS devices were all functional after pyrolysis. Salt atmosphere tests per MIL-STD-883C, method 1009 showed that 7 out of 10 passed 2 hours and 3 of 7 passed 4 hours in the test. A similar coating of silica derived from H-resin failed after 10 minutes in the test.

EXAMPLE 6

Nalco 84SS-258 (30% colloidal silica with a particle size of 20 nanometer diluted in a glycol propyl ether), 2.163 g, 2.0 g of triethoxysilane, 0.164 g water, 9.49 g isopropyl alcohol and 3.0 g n-butanol were mixed and heated at 60°-75° C. for 30 minutes. The coating composition was applied to the surface of 1×3 inch aluminum panel. The coated panel was air dried for 10 minutes and pyrolyzed at 400° C. for 1 hour in air. A Motorola 14011B CMOS device and a 1 inch square silicon wafer were also spin coated with the above liquid mixture at 3000 RPM for 15 seconds. The coated parts were then heated at 400° C. for 4 hours in air. FTIR showed essentially complete conversion to silica. The CMOS device was functional after pyrolysis and survived 4 hrs of the salt atmosphere tests of Example 5 (failed at 24 hrs).

EXAMPLE 7

Four grams of silicon metal with a particle size less than 10 micrometers, 1.0 g of Hydrogen silsesquioxane resin made by the method of Collins et al. in U.S. Pat. No. 3,615,273, and 0.4 g glycidoxypropyltrimethoxysilane were mixed in 2.5 g of cyclic polydimethylsiloxane. The material was thoroughly dispersed using a sonic probe. The coating composition was applied to the surface of a 4.5 inch square alumina substrate (40 mil thick) using a 3 mil drawdown bar. The sample was air dried for 3.5 hours and then heated at 400° C. for 1 hour in air. The resultant coating was 59 microns thick. Examination of the coating under a microscope showed no cracks at 1000X.

EXAMPLE 8

Four grams of magnesium metal with a particle size less than about 11.3 micrometers, 1.0 g of Hydrogen silsesquioxane resin made by the method of Collins et al. in U.S. Pat. No. 3,615,273, and 0.4 g glycidoxypropyltrimethoxysilane were mixed in 4.5 g of cyclic polydimethylsiloxane. The material was thoroughly dispersed using a sonic probe. The coating composition was applied to the surface of a 4.5 inch square alumina substrate (40 mil thick) using a 3 mil drawdown bar. The sample was air dried for 2 hours 40 minutes and then heated at 400° C. for 1 hour in air. The resultant coating was 65 microns thick. Examination of the coating under a microscope showed no cracks at 1000X.

What is claimed is:

1. A coating composition comprising a silica precursor resin and a filler diluted in a solvent, wherein the filler is a metal which reacts in an oxidizing atmosphere to liberate heat selected from the group consisting of magnesium, iron, silicon, tin and zinc.

2. The composition of claim 1 wherein the silica precursor resin is selected from the group consisting of hydrogen silsesquioxane resin and hydrolyzed or partially hydrolyzed $R_nSi(OR)_{4-n}$, wherein R is an aliphatic, alicyclic or aromatic substituent of 1–20 carbon atoms and n is 0–3.

3. The composition of claim 1 also containing a modifying ceramic oxide precursor comprising a compound containing an element selected from the group consisting of titanium, zirconium, aluminum, tantalum, vanadium, niobium, boron and phosphorous wherein the compound contains at least one hydrolyzable substituent selected from the group consisting of alkoxy or acyloxy and the compound is present in an amount such that the coating contains 0.1 to 30 percent by weight modifying ceramic oxide.

4. The composition of claim 2 also containing a platinum, rhodium or copper catalyst in an amount of between about 5 and about 1000 ppm platinum, rhodium or copper based on the weight of hydrogen silsesquioxane resin.

5. The composition of claim 1 also containing a material which modifies the surface of the filler.

6. The composition of claim 1 also containing a suspending agent.

7. The composition of claim 1 wherein the filler is in a form selected from the group consisting of powders, particles, and flakes.

8. The composition of claim 1 wherein the filler is present in the coating composition in an amount in the range of about 5 to about 80 weight percent.

* * * * *